(12) United States Patent
Kale et al.

(10) Patent No.: US 8,085,584 B1
(45) Date of Patent: Dec. 27, 2011

(54) MEMORY TO STORE USER-CONFIGURABLE DATA POLARITY

(75) Inventors: Poorna Kale, Folsom, CA (US); Greg Komoto, Sacramento, CA (US); Gerald Barkley, Oregon, WI (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 12/627,214

(22) Filed: Nov. 30, 2009

(51) Int. Cl.
*G11C 11/00* (2006.01)

(52) U.S. Cl. ............... 365/163; 365/148; 365/189.07

(58) Field of Classification Search .......... 365/163, 365/148, 189.07
See application file for complete search history.

(56) References Cited

U.S. PATENT DOCUMENTS 5,825,782 A * 10/1998 Roohparvar .............. 714/718
5,910,807 A * 6/1999 Ueda et al. ................ 345/531
2011/0103159 A1 * 5/2011 Noorlag ................. 365/189.011

* cited by examiner

*Primary Examiner* — Huan Hoang
(74) *Attorney, Agent, or Firm* — Berkeley Law & Technology Group, LLP

(57) ABSTRACT

Subject matter disclosed herein relates to user configuration of polarity of data storage in memory devices.

22 Claims, 4 Drawing Sheets

MEMORY TO STORE USER-CONFIGURABLE DATA POLARITY

BACKGROUND

1. Field

Subject matter disclosed herein relates to user configuration of polarity of data storage in memory devices.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Non-volatile memory may involve asymmetrical latencies between storing data of '1' and '0' due to technology limitations and/or intentional design of such memory. For example, a PCM device may take longer to store a '1' than to store a '0'. Also, within a given system, from the same memory, some applications may involve faster storage of '1's while other applications may involve faster storage of '0's. As a result, such asymmetrical latencies may result in limiting choices of available memory type for a given application.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
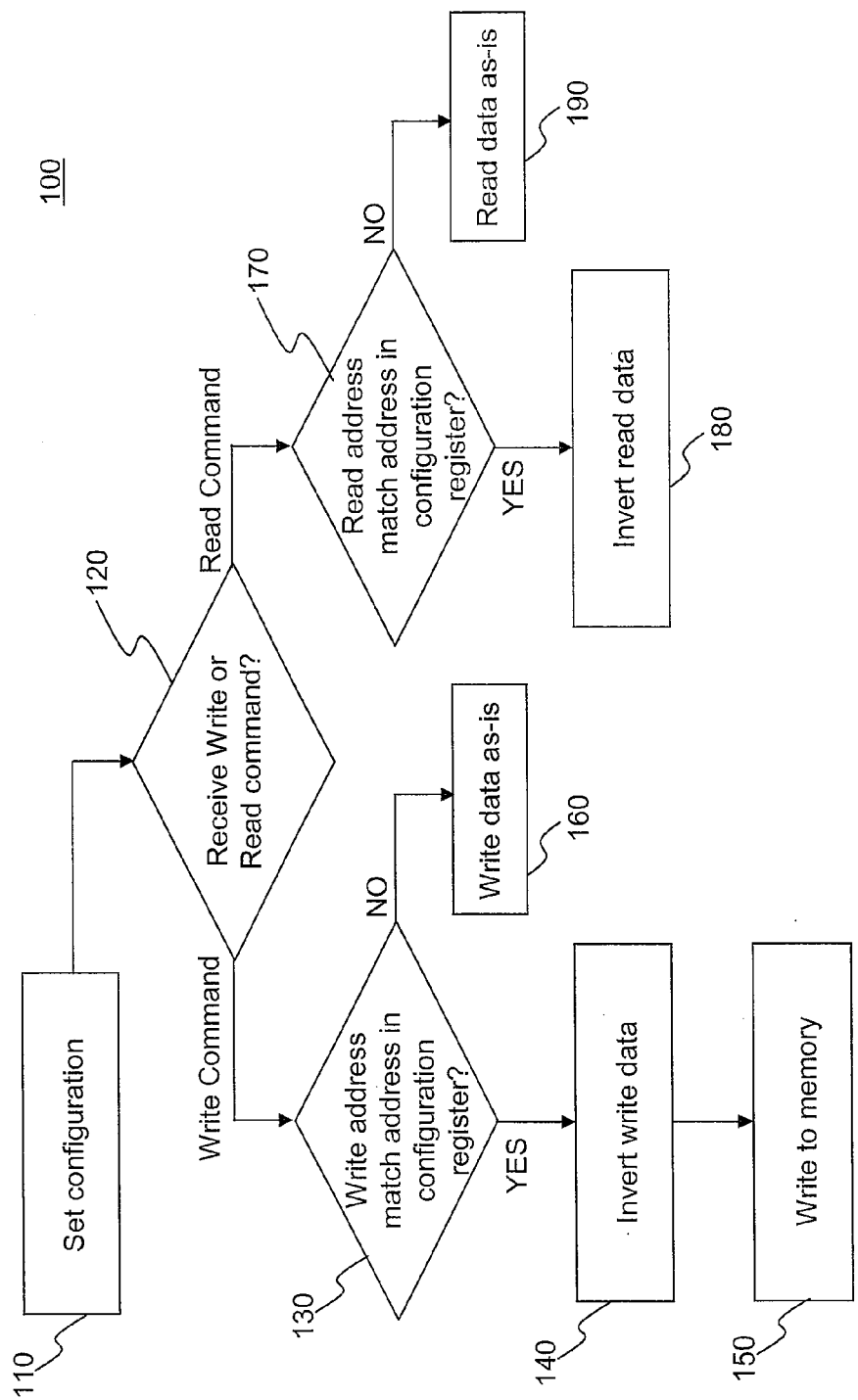
FIG. 1 is a flow diagram of a memory write/read process, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device may enable a user to configure the polarity of data storage in a non-volatile memory. Here, polarity refers to the state of data, such as "high" and "low" or "1" and "0", for example. Configuring data polarity may comprise inverting bit polarity and/or maintaining (e.g., not changing) bit polarity. For example, in a case where data comprises "1"s and "0"s, inverting such data may involve converting "1"s to "0"s and/or "0"s to "1"s, and maintaining such data may involve maintaining "1"s and "0"s in an original polarity (e.g., no inversion). In a particular embodiment, a memory device may comprise a nonvolatile, discretely-addressable memory to provide relatively fine-grained control of particular areas of a memory array. Accordingly, a user may configure the polarity of data storage in portions of such a memory array. Such portions may comprise one or more partitions, blocks, and/or pages, for example. Polarity configuration for a memory device may be changed on-the-fly, such as during operation of the memory device, in order to accommodate write data having inverted polarity. Such memory device operation may include run-time processes such as read/write processes initiated by a processor, for example. Such on-the-fly polarity configuration may also support a process of inverting the polarity of data stored at particular locations of a memory array as it is read from the memory array, for example.

User configurable data polarity may provide benefits such as improving speed of storing write data by taking advantage of asymmetrical latencies that may be associated with a particular memory device. For example, for phase change memory (PCM), a process to store one state may be slower than a process to store another state. In one embodiment, the former state may be initially assigned a "1" value and the latter state may be assigned a "0". Accordingly, it may be beneficial to invert the polarity of data so that "1"s are changed to "0"s prior to writing the data to such a PCM. In another example, memory sectors of flash memory devices may be initialized with background data comprising all "1"s (subsequent to an erase process, for example). Applications, which may utilize such a memory device during execution, for example, may benefit from faster storage of "0"s. Accordingly, it may be beneficial to invert "1"s to "0"s prior to writing to such a Flash memory device. Thus, configuring polarity of data may provide a benefit of achieving improved performance of a memory device, in terms of write/read latencies, for example, by exploiting a memory device's inherent asymmetrical latency between storing '1's and '0's. Of course, such details and advantages of configuring data polarity for data stored in memory are merely examples, and claimed subject matter is not so limited.

In one embodiment, a user may write to a bit polarity configuration register to store one or more addresses and/or ranges of addresses of a memory array where inverted-polarity write data is to be stored. Such a bit polarity configuration register, which may be included within a memory device, for example, may comprise a nonvolatile memory to maintain address information during power-off. Accordingly, address information stored in a bit polarity configuration register may describe which portions of a memory array are to store inverted-polarity write data and/or non-inverted-polarity write data. Also, for use during a read operation, such address information stored in a bit polarity configuration register may describe which portions of a memory array store inverted-polarity data and/or non-inverted-polarity data, though claimed subject matter is not so limited.

As mentioned above, a memory device may provide a user with an ability to configure polarity of a memory array in terms of memory partitions, blocks, and/or pages. For example, such ability may be implemented subsequent to a user providing polarity configuration instructions via an interface of a memory device that includes the memory array. In another implementation, such polarity configuration instructions may be provided from the memory device itself, as a result of executing program instructions maintained in the memory device, for example. Polarity configuration instructions, which may comprise one or more addresses and/or ranges of addresses of a memory array, as described above, may be changed by a user and/or a system application as often as desired. For example, one application, during execution, may configure the polarity of data storage differently than a subsequently executed application.

In one particular embodiment, a process of determining whether bit polarity is to be switched or maintained may include comparing the number of data storage locations in one state versus the other state, and assessing the number of changes involved with and without such polarity changes. Accordingly, bit polarity may be changed based, at least in part, on a comparison of the two assessment numbers and a performance ratio that is set based, at least in part, on a performance difference in changing from one state to another.

In one embodiment, data polarity inversion may be carried out by a write state machine, which may be implemented in logic within a memory device, for example. Such a write state machine may compare write data and bit polarity registers: if bit polarity register addresses match write state machine addresses, for example, the write state machine may consequently invert the write data as it is written to the memory device, though claimed subject matter is not so limited. During a read instruction, a data polarity match circuit included within a memory device may compare one or more addresses associated with the read instruction to one or more addresses stored in a bit polarity configuration register: if a match occurs, polarity of the output data may be inverted, for example.

FIG. 1 is a flow diagram of a memory write/read process 100, according to an embodiment. At block 110, a user and/or an application, for example, may determine which portions of a memory array are to store inverted and/or non-inverted polarity data by setting a polarity configuration to be stored in a bit polarity configuration register. In one implementation, a selection of a particular polarity configuration for a memory device may be based, at least in part, on whether a performance of such a memory device improves during write processes involving an application or data that includes more "1's" than "0's", or vise versa. A user may read a configuration register of a memory device to view the polarity configuration of a particular portion of the memory device. The configuration register may be read by executing a particular command that instructs a memory controller, for example, to access the configuration register. In one implementation, a configuration register may be read while writing to the memory array.

Polarity configuration may be user-selectable for particular ranges of memory. Such ranges may comprise portions of a memory device allocated to user or system data storage, for example. Such ranges of memory may be associated with volume, file allocation block, and/or other high-level data management structure. Such a polarity configuration may comprise information regarding one or more addresses and/or ranges of addresses of a memory array, for example. At diamond 120, flow of process 100 may split into one of two directions depending on whether a write command or a read command is to be processed. If a write command is to be processed, as at diamond 130, for example, then a determination may be made as to whether a write address corresponding to the write command matches one or more memory array addresses, which may be stored in a bit polarity configuration register, that is to store inverted-polarity data. If so, then, at block 140, write data associated with the write command may be inverted, as described above, before being written to a memory array, as at block 150. On the other hand, if a write address does not match one or more addresses stored in the bit polarity configuration register, then, at block 160, write data associated with the write command may be written to the memory array without changing the polarity of the write data.

If a read command is to be processed, as at diamond 170, for example, then a determination may be made as to whether a read address corresponding to the read command matches one or more memory array addresses, which may be stored in a bit polarity configuration register, where inverted-polarity data may be stored. If so, then, at block 180, read data may be inverted, as described above. On the other hand, if a read address does not match one or more addresses stored in the bit polarity configuration register, then, at block 190, read data associated with the read command may be read without changing the polarity of the read data. Of course, such details of read and write processes are merely examples, and claimed subject matter is not so limited.

Figure 2:
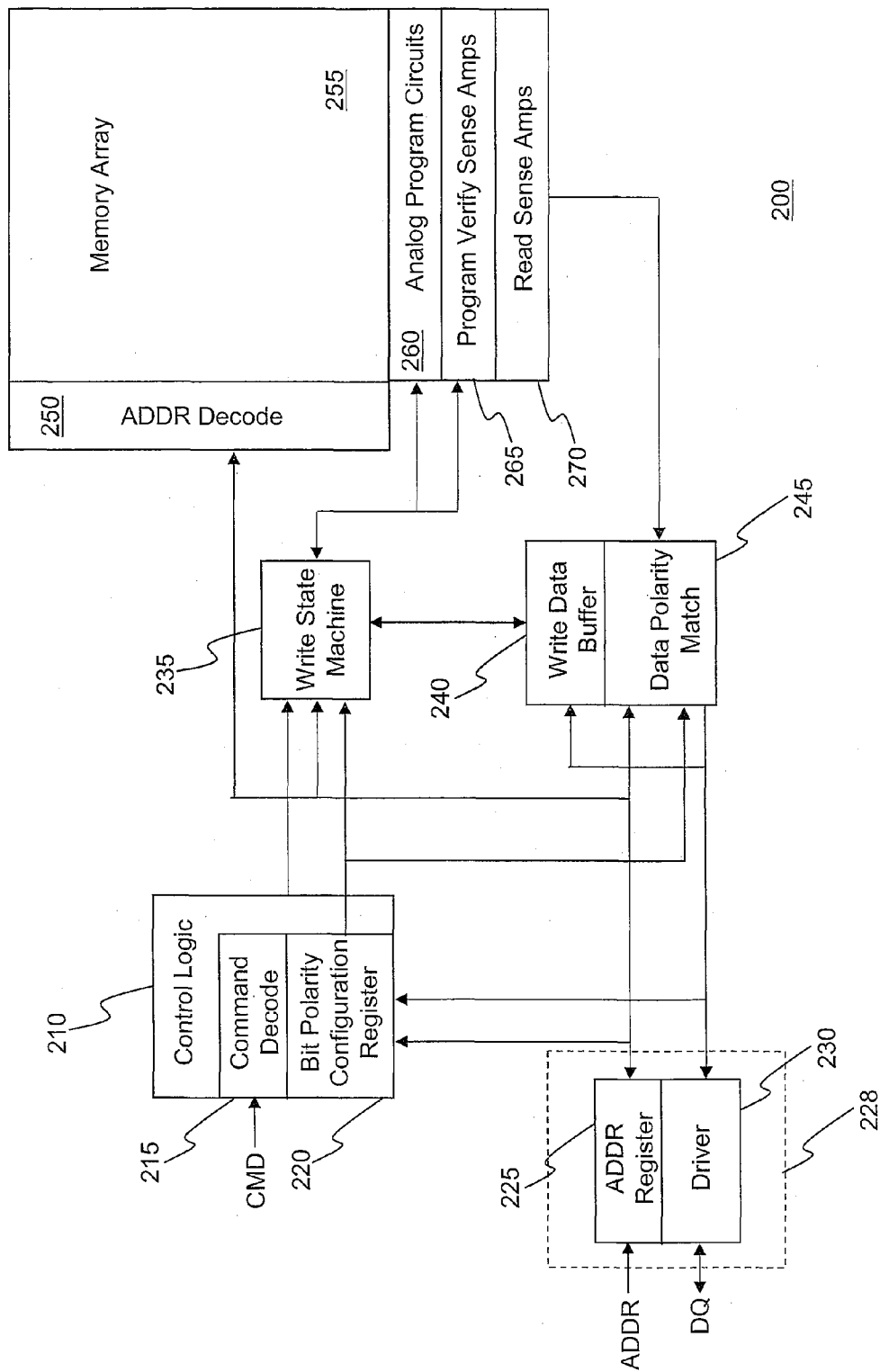
FIG. 2 is a schematic block diagram of a memory device, according to an embodiment.

FIG. 2 is a schematic block diagram of a memory device 200, according to an embodiment. Memory device 200 may be partitioned into multiple portions, which may store inverted-polarity data and/or non-inverted-polarity data. Memory device 200 may comprise NAND or NOR flash memories, SRAM, DRAM, or PCM, just to name a few examples. Memory device 200 may include memory array 255 comprising a user-addressable memory space including such memory portions, which may or may not be contiguous with one another, and may or may not reside on a single device or die. Such memory portions may comprise independent addressable memory spaces that may be accessed by read, write, and/or erase processes, for example.

According to an embodiment, one or more portions of memory device 200 may store signals representative of data and/or information as expressed by a particular state of memory device 200. For example, an electronic signal representative of data and/or information may be "stored" in a portion of memory device 200 by affecting or changing the state of such portions of memory device 200 to represent data and/or information as binary information (e.g., ones and zeros). As such, in a particular implementation, such a change of state or polarity of the portion of memory to store a signal representative of data and/or information constitutes a transformation or inversion of memory device 200 to a different state or thing.

Figure 4:
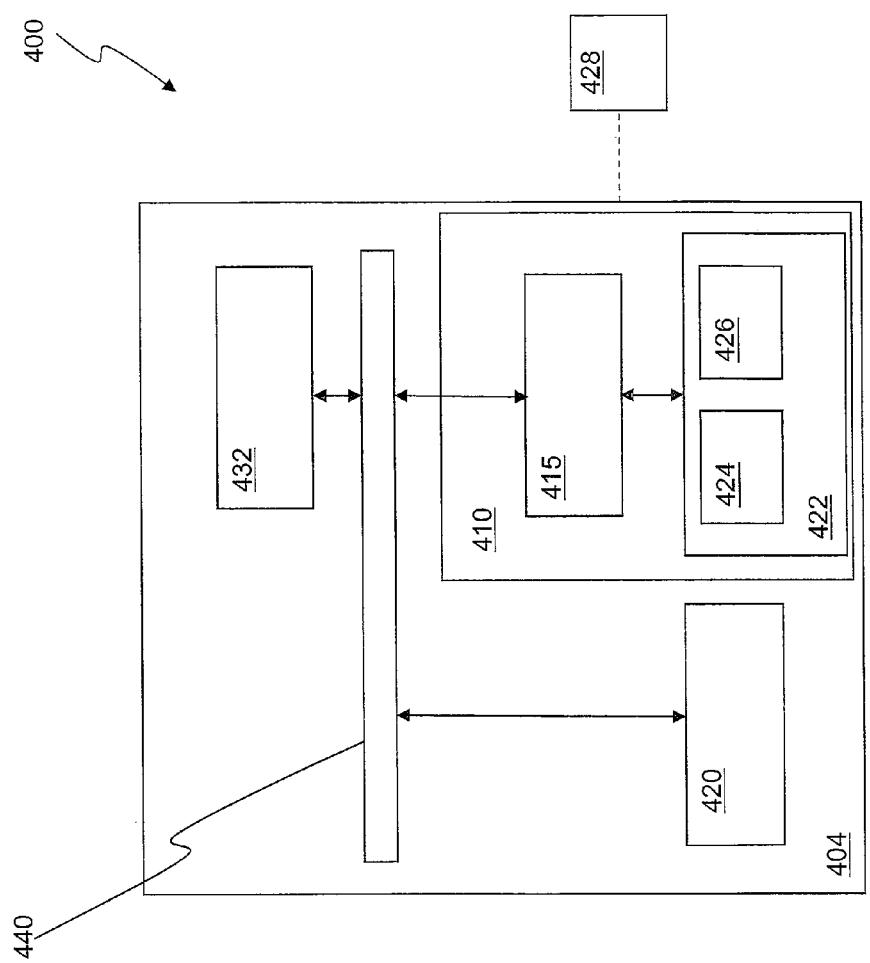
FIG. 4 is a schematic block diagram of a computing system and a memory device, according to an embodiment.

Memory device 200 may receive information comprising a command CMD, one or more addresses ADDR, and/or write data DQ, for example. Control logic 210 may include a command decode portion 215 and a bit polarity configuration register 220. In a particular embodiment, control logic 210 may comprise a memory controller external (e.g., residing on a separate die) to memory device 200, though claimed subject matter is not so limited. Command decode portion 215 may receive commands CMD, such as read and/or write, for example, from a user and/or a system application executed by one or more processors (FIG. 4). In one implementation, bit polarity configuration register 220 may comprise volatile or nonvolatile memory to store instructions and/or memory addresses specifying locations of memory array 255 where data having inverted polarity is stored and/or where data having non-inverted polarity is stored, as explained above. Such specified locations of memory array 255 may comprise memory portions such as partitions, blocks, and/or pages, for example, though claimed subject matter is not so limited.

Memory device 200 may include a data port 228 through which input and/or output data enters and/or leaves memory device 200. Data port 228 may comprise an address register 225 to receive one or more addresses associated with commands CMD received by command decode portion 215. Memory array 255 may include an address decode block 250 to receive and/or decode address information from address register 225. Memory array 255 may also include analog program circuits 260 to write input data DQ onto memory array 255. Driver 230 may comprise an interface for input and/or output data DQ, for example. Write state machine 235, which is described in further detail below, may comprise match detection (e.g., compare) circuitry (FIG. 3), for example, to compare address information maintained in bit polarity configuration register 220 with addresses ADDR received at ADDR register 225. Write state machine 235 may also comprise inverter circuitry (not shown), for example, to selectively invert data polarity of data received via driver 230, for example. One or more functions carried out by write state machine 235, such as compare and/or invert, for example, may involve buffering data at write data buffer 240.

Memory array 255 may include program verify sense amplifiers 265 to carry out a process of verifying write data. Read sense amplifiers 270 may be used in a process of reading data stored in memory array 255 whether or not such data has inverted polarity. Write state machine 235 may invert the polarity of read data based, at least in part, on memory address information maintained in bit polarity configuration registers 220. Data polarity match block 245 may compare a read/write address to a configuration register address. For example, a read match may invert data that was read from memory array 255. whereas a write match may invert data written to the memory array. Of course, details of such a memory device configuration are merely examples, and claimed subject matter is not so limited.

Figure 3:
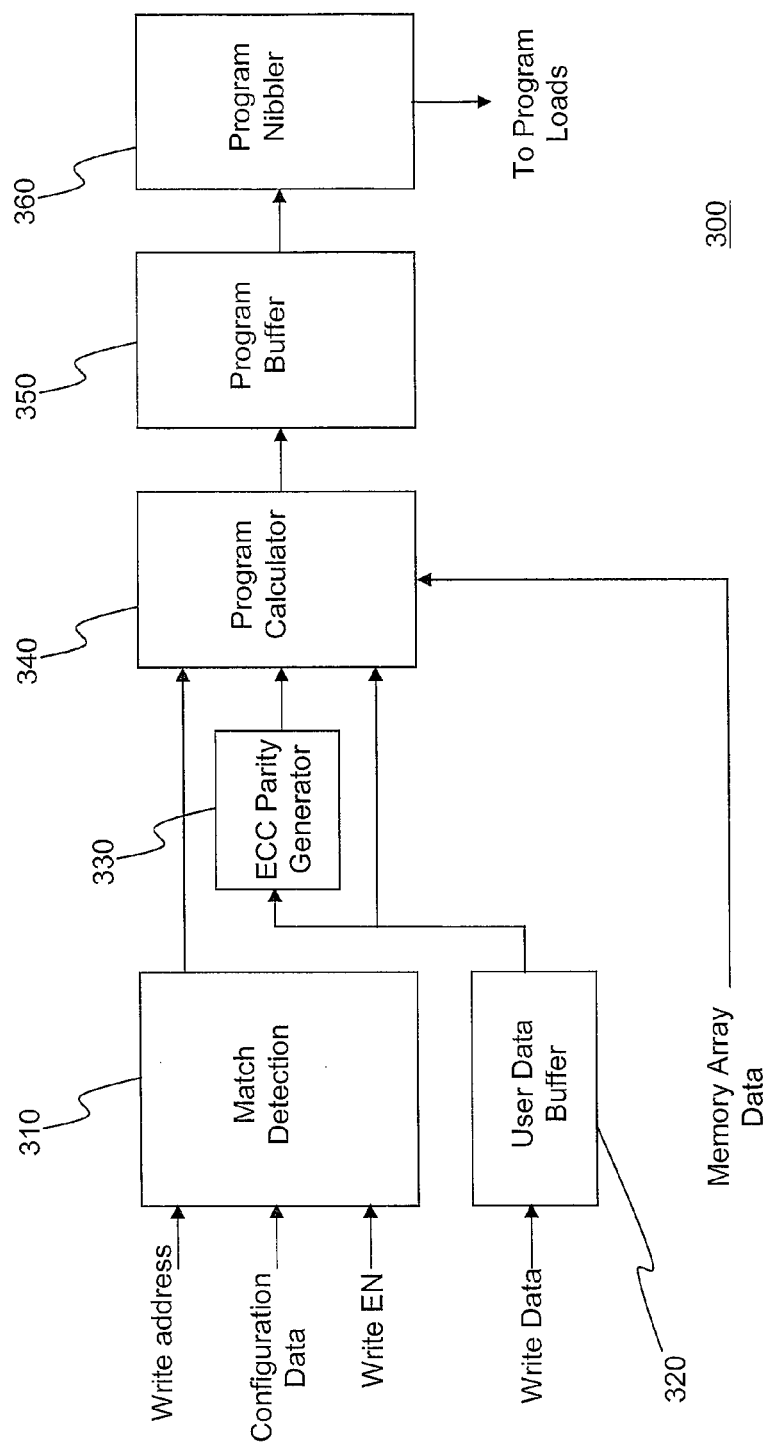
FIG. 3 is a schematic block diagram of a write state machine, according to an embodiment.

FIG. 3 is a schematic block diagram of a write state machine 300, according to an embodiment. Such a write state machine may be implemented in hardware, for example using electronic logic devices, for example. In such a case, write state machine 300 may include a comparator (not shown) to compare memory addresses associated with write data to memory locations that store inverted-polarity data. Write state machine 300 may include an inverter (not shown) to invert write data based, at least in part, on such a comparison made by the comparator. In another embodiment, write state machine 300 may be implemented in software that, if executed by a processor, performs compare and invert functions described above, for example. Write state machine 300 may comprise write state machine 235 shown in FIG. 2, for example. Match detection 310 may be used to determine whether polarity of write data is to be inverted based, at least in part, on a comparison between a write address associated with a write command and configuration data provided by a bit polarity configuration register, such as bit polarity configuration register 220 shown in FIG. 2, for example. During such a determination, write data may be stored in user data buffer 320, though claimed subject matter is not so limited. An error correction code (ECC) parity generator 330 may provide ECC parity to program calculator 340 based, at least in part, on write data. In one implementation, ECC parity generator 330 may comprise combinational logic circuitry that produces parity bits used to correct errors in read and/or write data. Such an ECC parity generator may or may not be enabled in a device to correct for both soft (transient) and/or hard (permanent) defects in storage media.

Program calculator 340 may determine which bits to be written to a memory array are to be modified (e.g., inverted polarity) based, at least in part, on write data, ECC parity, a determination by match detection 310, and/or memory array data, for example. Results of program calculator 340 may be stored in program buffer 350. Program nibbler 360 may comprise at least a portion of a state machine that compares write data to array data to determine whether the array data is to be modified. If a comparison is "TRUE" then data in the memory array may be modified. If the comparison is "FALSE" then data in the memory array may be unmodified.

FIG. 4 is a schematic block diagram of a computing system 400 and a memory device 410, according to an embodiment. Memory device 410 may comprise memory device 200 shown in FIG. 2, for example. A computing device 404 may be representative of any device, appliance, and/or machine that may be configurable to manage memory device 410. Memory device 410 may include a memory controller 415 and a memory 422. By way of example but not limitation, computing device 404 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 400, and the processes and/or methods described above, may be implemented using or otherwise including hardware, firmware, software, or any combination thereof. Thus, by way of example but not limitation, computing device 404 may include at least one processing unit 420 that is operatively coupled to memory 422 through a bus 440 and a host or memory controller 415. Processing unit 420 is representative of one or more circuits configurable to perform at least a portion of a data computing procedure or process. By way of example but not limitation, processing unit 420 may include one or more processors, controllers, microprocessors, microcontrollers, application specific integrated circuits, digital signal processors, programmable logic devices, field programmable gate arrays, and the like, or any combination thereof. Processing unit 420 may communicate with memory controller 415 to process memory-related operations, such as read, write, and/or erase, as well as memory partition processes discussed above, for example. Processing unit 420 may include an operating system configured to communicate with memory controller 415. Such an operating system may, for example, generate commands to be sent to memory controller 415 over bus 440. Such commands may include instructions to partition at least a portion of memory 422, and/or to associate one or more particular partitions with inverted-polarity data, for example.

Memory 422 is representative of any data storage mechanism. Memory 422 may include, for example, a primary memory 424 and/or a secondary memory 426. In a particular embodiment, memory 422 may comprise memory that may be partitioned to store inverted-polarity data in particular portions of memory 422, as described above. Primary memory 424 may include, for example, a random access memory, read only memory, etc. While illustrated in this example as being separate from processing unit 420, it should be understood that all or part of primary memory 424 may be provided within or otherwise co-located/coupled with processing unit 420.

Secondary memory 426 may include, for example, the same or similar type of memory as primary memory and/or one or more data storage devices or systems, such as, for example, a disk drive, an optical disc drive, a tape drive, a solid state memory drive, etc. In certain implementations, secondary memory 426 may be operatively receptive of or otherwise configurable to couple to, a computer-readable medium 428. Computer-readable medium 428 may include, for example, any medium that can carry and/or make accessible data, code, and/or instructions for one or more of the devices in system 400.

Computing device 404 may include, for example, an input/output 432. Input/output 432 is representative of one or more devices or features that may be configurable to accept or otherwise introduce human and/or machine inputs, and/or one or more devices or features that may be configurable to deliver or otherwise provide for human and/or machine outputs. Such human or user input may comprise instructions to configure memory 422 to store inverted-polarity data, for example. By way of example but not limitation, input/output device 432 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Unless specifically stated otherwise, as apparent from the discussion above, it is appreciated that throughout this specification discussions utilizing terms such as "processing," "computing," "calculating," "determining" or the like refer to actions or processes of a specific apparatus, such as a special purpose computer or a similar special purpose electronic computing device. In one example, such a special purpose computer or special purpose electronic computing device may comprise a general purpose computer programmed with instructions to perform one or more specific functions. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   an input port to receive write data comprising memory addresses;
   a bit polarity configuration register to store location information regarding memory locations to store inverted data; and
   a write state machine to invert said write data to be written to said memory locations to store inverted data, said write state machine to invert said write data based, at least in part, on a predicted difference in read or write latency for storing said inverted write data compared to read or write latency for storing non-inverted write data.

2. The memory device of claim 1, wherein said write state machine comprises:
   a comparator to compare said memory addresses and said memory locations to store said inverted write data; and
   an inverter to invert said write data based, at least in part, on said comparison.

3. The memory device of claim 1, wherein said bit polarity configuration register is adapted to store location information regarding ranges of memory locations to store inverted data.

4. The memory device of claim 1, wherein said bit polarity configuration register comprises a nonvolatile memory.

5. The memory device of claim 1, further comprising a partitionable memory array to store inverted data and non-inverted data.

6. The memory device of claim 5, wherein said partitionable memory array is partitionable into blocks and/or pages.

7. The memory device of claim 1, further comprising a read sense amp to provide said write state machine with inverted stored data.

8. The memory device of claim 1, further comprising a nonvolatile, discretely-addressable phase-change memory (PCM).

9. A method comprising:
   setting a bit polarity configuration register to store one or more memory addresses based, at least in part, on a predicted difference in read or write latency for storing inverted write data compared to read or write latency for storing non-inverted write data;
   comparing addresses of said write data with said one or more memory addresses; and
   inverting said write data based, at least in part, on said comparison.

10. The method of claim 9, wherein said one or more memory addresses comprise ranges of memory locations.

11. The method of claim 9, wherein said bit polarity configuration register comprises a nonvolatile memory.

12. The method of claim 9, further comprising partitioning a memory array to store inverted data and non-inverted data.

13. The method of claim 12, wherein said partitionable memory array is partitionable into blocks and/or pages.

14. The method of claim 9, further comprising:
   reading stored data;
   comparing said addresses of said read data with said one or more memory addresses; and
   inverting said read data based, at least in part, on said comparison.

15. The method of claim 9, further comprising:
   receiving user input to set said bit polarity configuration register.

16. The method of claim 9, further comprising
comparing a number of occurrences of one state versus a number of occurrences of the other state of said write data to determine said predicted difference.

17. The method of claim 9, wherein said setting said bit polarity configuration register to store one or more memory addresses is based, at least in part, on a selection of an application for execution.

18. A system comprising:
a memory controller to provide write data and associated memory addresses to a memory device, wherein said memory device comprises:
   a bit polarity configuration register to store location information regarding memory locations to store inverted data; and
   a write state machine to invert said write data to be written to said memory locations to store inverted data, said write state machine to invert said write data based, at least in part, on a predicted difference in read or write latency for storing said inverted write data compared to read or write latency for storing non-inverted write data.

19. The system of claim 18, wherein said write state machine comprises:
   a comparator to compare said associated memory addresses and said memory locations to store said inverted write data; and
   an inverter to invert said write data based, at least in part, on said comparison.

20. The system of claim 18, wherein said bit polarity configuration register is adapted to store location information regarding ranges of memory locations to store inverted data.

21. The system of claim 18, wherein said bit polarity configuration register comprises a nonvolatile memory.

22. The system of claim 18, wherein said memory device comprises a nonvolatile, discretely-addressable phase-change memory (PCM).

* * * * *